(12) United States Patent
Lee et al.

(10) Patent No.: US 10,270,948 B2
(45) Date of Patent: Apr. 23, 2019

(54) SUBSTRATE FOR CAMERA MODULE AND CAMERA MODULE HAVING THE SAME

(71) Applicant: SAMSUNG ELECTRO-MECHANICS CO., LTD., Suwon-si, Gyeonggi-do (KR)

(72) Inventors: Seung Eun Lee, Suwon-si (KR); Jin Seon Park, Suwon-si (KR); Yul Kyo Chung, Suwon-si (KR); Chul Choi, Suwon-si (KR); Dae Young Jung, Suwon-si (KR); Seung Yeop Kook, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 84 days.

(21) Appl. No.: 15/370,604

(22) Filed: Dec. 6, 2016

(65) Prior Publication Data

US 2017/0294469 A1 Oct. 12, 2017

(30) Foreign Application Priority Data

Apr. 11, 2016 (KR) .................. 10-2016-0044257

(51) Int. Cl.
*H04N 5/225* (2006.01)
*H01L 27/146* (2006.01)
*H01L 25/18* (2006.01)
*H01L 23/00* (2006.01)

(52) U.S. Cl.
CPC .......... *H04N 5/2253* (2013.01); *H01L 24/20* (2013.01); *H01L 25/18* (2013.01); *H01L 27/14618* (2013.01); *H01L 27/14625* (2013.01); *H01L 2224/04105* (2013.01)

(58) Field of Classification Search
None
See application file for complete search history.

(56) References Cited

U.S. PATENT DOCUMENTS

| 7,556,442 | B2 | 7/2009 | Frantz et al. | |
|---|---|---|---|---|
| 2003/0102570 | A1* | 6/2003 | Imasu | H01L 21/563 257/778 |
| 2005/0116138 | A1* | 6/2005 | Hanada | H01L 24/97 250/206 |
| 2006/0022310 | A1* | 2/2006 | Egitto | B82Y 10/00 257/642 |

(Continued)

FOREIGN PATENT DOCUMENTS

| JP | 2005-101711 A | 4/2005 |
|---|---|---|
| JP | 3110007 U | 6/2005 |
| JP | 2010-103628 A | 5/2010 |

(Continued)

*Primary Examiner* — Mark T Monk
(74) *Attorney, Agent, or Firm* — Morgan Lewis & Bockius LLP

(57) ABSTRACT

A substrate for a camera module includes: a first substrate; an image sensor installed on the first substrate and a memory chip installed to be embedded in the first substrate. The first substrate includes a soft substrate portion disposed at a central portion of the first substrate, and a hard substrate portion formed on upper and lower portions of the soft substrate portion, and at least a portion of the memory chip is disposed in an installation hole formed in the soft substrate portion.

5 Claims, 5 Drawing Sheets

(56) References Cited

U.S. PATENT DOCUMENTS

2012/0092838 A1* 4/2012 Kitano ................ H05K 1/0215
                                                                                      361/749

FOREIGN PATENT DOCUMENTS

| JP | 2013-183425 A | 9/2013 |
|----|---------------|--------|
| JP | 2013-232756 A | 11/2013 |
| KR | 10-2004-0015971 A | 2/2004 |
| WO | 2013/161217 A1 | 10/2013 |

* cited by examiner

SUBSTRATE FOR CAMERA MODULE AND CAMERA MODULE HAVING THE SAME

CROSS-REFERENCE TO RELATED APPLICATION(S)

This application claims the benefit of priority to Korean Patent Application No. 10-2016-0044257, filed on Apr. 11, 2016 with the Korean Intellectual Property Office, the entire disclosure of which is incorporated herein by reference.

TECHNICAL FIELD

The present disclosure relates to a substrate for a camera module and a camera module having the same.

BACKGROUND

There has been increased demand for the development of a high speed camera module for mobile devices capable of implementing high speed photography, including such features as super slow motion and an anti-distortion shutter.

In this case, in order to process mass image data photographed at high speed, an image sensor needs to have a memory, but when the image sensor and the memory are disposed to be parallel to each other on a substrate, the size of the camera module is increased.

Therefore, a development of the camera module capable of implementing high speed photography without increasing the size of the camera module is required.

SUMMARY

An aspect of the present disclosure may provide a substrate for a camera module enabling high speed photography, and a camera module having the same.

According to an aspect of the present disclosure, a substrate for a camera module includes: a first substrate; an image sensor installed on the first substrate; and a memory chip installed to be embedded in the first substrate, wherein the first substrate includes a soft substrate portion disposed at a central portion of the first substrate, and a hard substrate portion formed on upper and lower portions of the soft substrate portion, and where at least a portion of the memory chip is disposed in an installation hole formed in the soft substrate portion.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, exemplary embodiments of the present disclosure will be described in detail with reference to the accompanying drawings.

Figure 1:
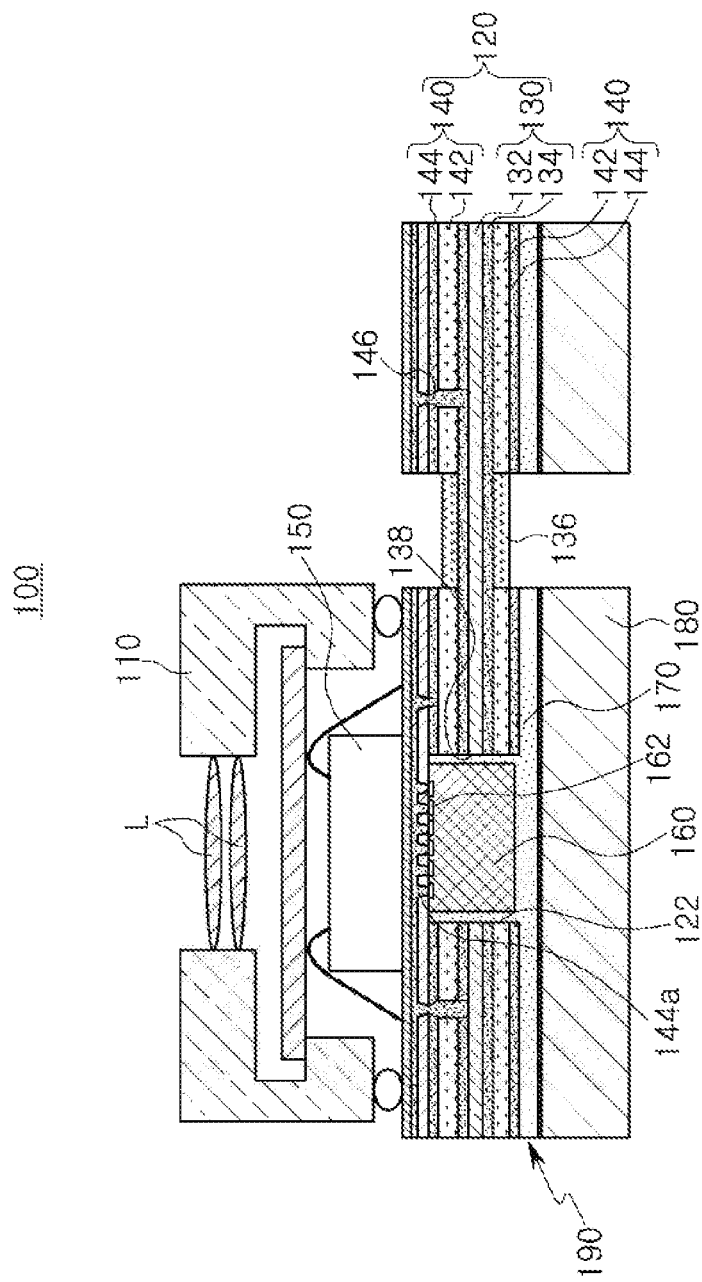
FIG. 1 is a schematic configuration view illustrating a camera module including a substrate for a camera module according to a first exemplary embodiment in the present disclosure.

FIG. 1 is a schematic configuration view illustrating a camera module including a substrate for a camera module according to a first exemplary embodiment in the present disclosure.

Referring to FIG. 1, a camera module 100, according to the first exemplary embodiment, may include a lens barrel 110, a first substrate 120, an image sensor 150, a memory chip 160, a resin layer 170, and a reinforcement plate 180, for example.

At least one lens L may be installed in the lens barrel 110, and the lens barrel 110 may be installed by bonding it to a top surface of the first substrate 120. As an example, the lens barrel 110 may have a cylindrical hollow shape, and may be formed to have at least one step on an internal surface and/or an external surface.

Although the present exemplary embodiment illustrates a case in which three members are installed in the lens barrel 110, the number of members installed on the lens barrel 110 is not limited thereto.

That is, the number of lenses installed in the lens barrel 110 and a shape of the lens barrel 110 may be variously modified.

The lens barrel 110 may be installed on the first substrate 120, and the image sensor 150 may be installed on the first substrate 120 so as to be disposed below the lens L installed in the lens barrel 110.

The first substrate 120 may include a soft substrate portion 130 disposed at a central portion thereof, and a hard substrate portion 140 disposed on upper and lower portions of the soft substrate portion 130.

The soft substrate portion 130 may include an insulating film 132 which is flexibly bent and a copper foil 134 formed on a top surface and a bottom surface of the insulating film 132. Further, a protection layer 136 may be formed on the soft substrate portion 130 which is exposed to the outside.

In addition, an installation hole 138 may be formed in the soft substrate portion 130, and the memory chip 160 may be disposed in the installation hole 138.

The hard substrate portion 140 may be formed on the upper and lower portions of the soft substrate portion 130. The hard substrate portion 140 may include an insulating layer 142 and a pattern layer 144. In addition, the insulating layer 142 and the pattern layer 144 may be alternately formed.

Meanwhile, a mounting groove 122, into which the memory chip 160 is installed to be inserted, may be formed in the first substrate 120. The mounting groove 122 may connect the hard substrate portion 140 disposed on the lower portion of the soft substrate portion 130 to the hard substrate portion 140 disposed on the upper portion of the soft substrate portion 130, through the soft substrate portion 130.

That is, the mounting groove 122 may include the installation hole 138 formed in the soft substrate portion 130.

The hard substrate portion 140 may include a via 144a for a connection with the memory chip 160. Further, a plurality of vias 146 for an electrical connection with the copper foil 134 of the soft substrate portion 130 may be formed in the hard substrate portion 140.

The image sensor 150 may be installed on the top surface of the first substrate 120 so as to be disposed below the lens L, and may be electrically connected to the first substrate 120 by a wire-bonding. However, the image sensor 150 is not limited to being connected to the first substrate 120 by the wire-bonding, but may be connected to the first substrate 120 by various methods.

The memory chip 160 may be installed to be embedded in the first substrate 120. As an example, the memory chip 160 may be disposed to be inserted in the mounting groove 122 of the first substrate 120. In addition, the memory chip 160 may include a connection pad 162 exposed to a top surface of the memory chip 160 to be connected to the via 144a of the hard substrate portion 140.

That is, the memory chip 160 may be disposed to be inserted in the mounting groove 122 of the first substrate 120, and may be electrically connected to the pattern layer 144 through the via 144a.

As such, since the memory chip is installed in the first substrate to be adjacent to the image sensor 150, memory capacity required for high speed photography may be provided. Accordingly, the high speed photography may be implemented.

The resin layer 170 may fill the mounting groove 122, and may be formed on a bottom surface of the hard substrate portion 140. The resin layer 170 may also fill the mounting groove 122, and may be formed only on the bottom surface of the hard substrate portion 140.

The resin layer 170 may serve to prevent an occurrence of mutual interference by an electromagnetic wave arising from the memory chip 160 or an electromagnetic wave arising from the image sensor 150.

The reinforcement plate 180 may be installed on the bottom surface of the first substrate 120. As another example, the reinforcement plate 180 may be installed in order to be bonded to the resin layer 170 through an adhesive.

The reinforcement plate 180 may serve to prevent the first substrate 120 from being bent by the mounting groove 122 when the image sensor 150 is installed. As an example of the composition of the reinforcement plate 180, the reinforcement plate 180 may be formed of a stainless material.

However, although the present exemplary embodiment describes a case in which the reinforcement plate 180 is installed by way of example, the reinforcement plate 180 may be omitted.

The first substrate 120, the image sensor 150, the memory chip 160, the resin layer 170, and the reinforcement plate 180 may configure a substrate 190 for a camera module.

As described above, since the memory chip 160 is installed in the first substrate 120 to be adjacent to the image sensor 150, memory capacity required for the high speed photography may be provided. Accordingly, high speed photography may be implemented.

That is, since the memory chip 160 is installed in the mounting groove 122 of the first substrate 120, the memory chip 160 may be directly and electrically connected to the image sensor 150 through the first substrate 120. Accordingly, memory capacity required for high speed photography may be provided.

Hereinafter, a second exemplary embodiment in the present disclosure will be described with reference to FIG. 2.

Figure 2:
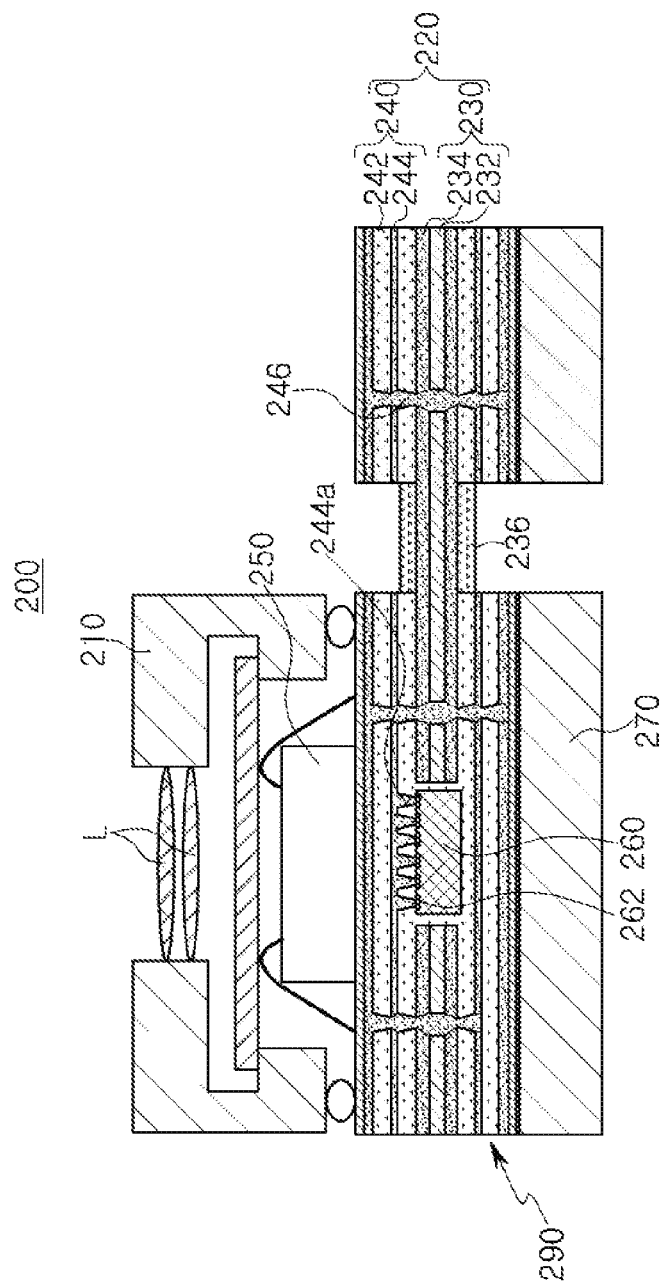
FIG. 2 is a schematic configuration view illustrating a camera module including a substrate for a camera module according to a second exemplary embodiment in the present disclosure.

FIG. 2 is a schematic configuration view illustrating a camera module including a substrate for a camera module according to a second exemplary embodiment in the present disclosure.

Referring to FIG. 2, a camera module 200, according to the second exemplary embodiment, may include a lens barrel 210, a first substrate 220, an image sensor 250, a memory chip 260, and a reinforcement plate 270, for example.

At least one lens L may be installed in the lens barrel 210, and the lens barrel 210 may be installed by bonding it to a top surface of the first substrate 220. As an example, the lens barrel 210 may have a cylindrical hollow shape, and may be formed to have at least one step on an internal surface and/or an external surface.

Although the present exemplary embodiment illustrates a case in which three members are installed in the lens barrel 210, the number of members installed in the lens barrel 210 is not limited thereto.

That is, the number of lenses installed in the lens barrel 210 and a shape of the lens barrel 210 may be variously modified.

The lens barrel 210 may be installed on the first substrate 220, and the image sensor 250 may be installed on the first substrate 220 so as to be disposed below the lens L installed in the lens barrel 210.

The first substrate 220 may include a soft substrate portion 230 disposed at a central portion thereof, and hard substrate portions 240 disposed on upper and lower portions of the soft substrate portion 230.

The soft substrate portion 230 may include an insulating film 232 which may be flexibly bent, a copper foil 234 formed on a top surface and a bottom surface of the insulating film 232. Further, a protection layer 236 may be formed on the soft substrate portion 230 which is exposed to the outside.

In addition, an installation hole 238 may be formed in the soft substrate portion 230, and the memory chip 260 may be disposed in the installation hole 238.

The hard substrate portion 240 may be formed on the upper and lower portions of the soft substrate portion 230. The hard substrate portion 240 may include an insulating layer 242 and a pattern layer 244. In addition, the insulating layer 242 and the pattern layer 244 may be alternately formed.

The hard substrate portion 240 may include a via 244a for a connection with the memory chip 260. Further, a plurality of vias 246 for an electrical connection with the copper foil 234 of the soft substrate portion 230 may be formed in the hard substrate portion 240.

The image sensor 250 may be installed on the top surface of the first substrate 220 so as to be disposed below the lens L, and may be electrically connected to the first substrate 220 by a wire-bonding. However, the image sensor 250 is not limited to being connected to the first substrate 220 by the wire-bonding, but may be connected to the first substrate 220 by various methods.

The memory chip 260 may be installed to be embedded in the first substrate 220. As an example, the memory chip 260 may be disposed to be inserted in the installation hole 238 of the soft substrate portion 230. In addition, the memory chip 260 may include a connection pad 262 exposed to a top surface of the memory chip 160, to be connected to the via 244a of the hard substrate portion 240.

That is, the memory chip 260 may be disposed to be inserted in the installation hole 238 of the soft substrate portion 230, and may be electrically connected to the pattern layer 244 through the via 244a.

As such, since the memory chip 260 is installed in the first substrate 220 to be adjacent to the image sensor 250, memory capacity required for high speed photography may be provided. Accordingly, the high speed photography may be implemented.

The reinforcement plate 270 may be installed on the bottom surface of the first substrate 220. As an example, the reinforcement plate 270 may be installed by bonding it to the first substrate 220 by means of an adhesive.

The reinforcement plate 270 may serve to prevent the first substrate 220 from being bent due to the installation hole 239, for installation of the memory chip 250, when the image sensor 150 is installed. Here, the reinforcement plate 270 may be formed of a stainless material.

However, although the present exemplary embodiment describes a case in which the reinforcement plate 270 is installed by way of example, the reinforcement plate 270 may be omitted.

The first substrate 220, the image sensor 250, the memory chip 260, and the reinforcement plate 270 may configure a substrate 290 for a camera module.

As described above, since the memory chip 260 is installed in the first substrate 220 to be adjacent to the image sensor 250, memory capacity required for the high speed photography may be provided. Accordingly, the high speed photography may be implemented.

That is, since the memory chip 260 is installed in the installation hall 238 of the first substrate 220, the memory chip 260 may be directly and electrically connected to the image sensor 250 through the first substrate 220. Accordingly, since memory capacity required for the high speed photographing may be provided.

Hereinafter, a camera module according to a third exemplary embodiment in the present disclosure will be described with reference to FIG. 3.

Figure 3:
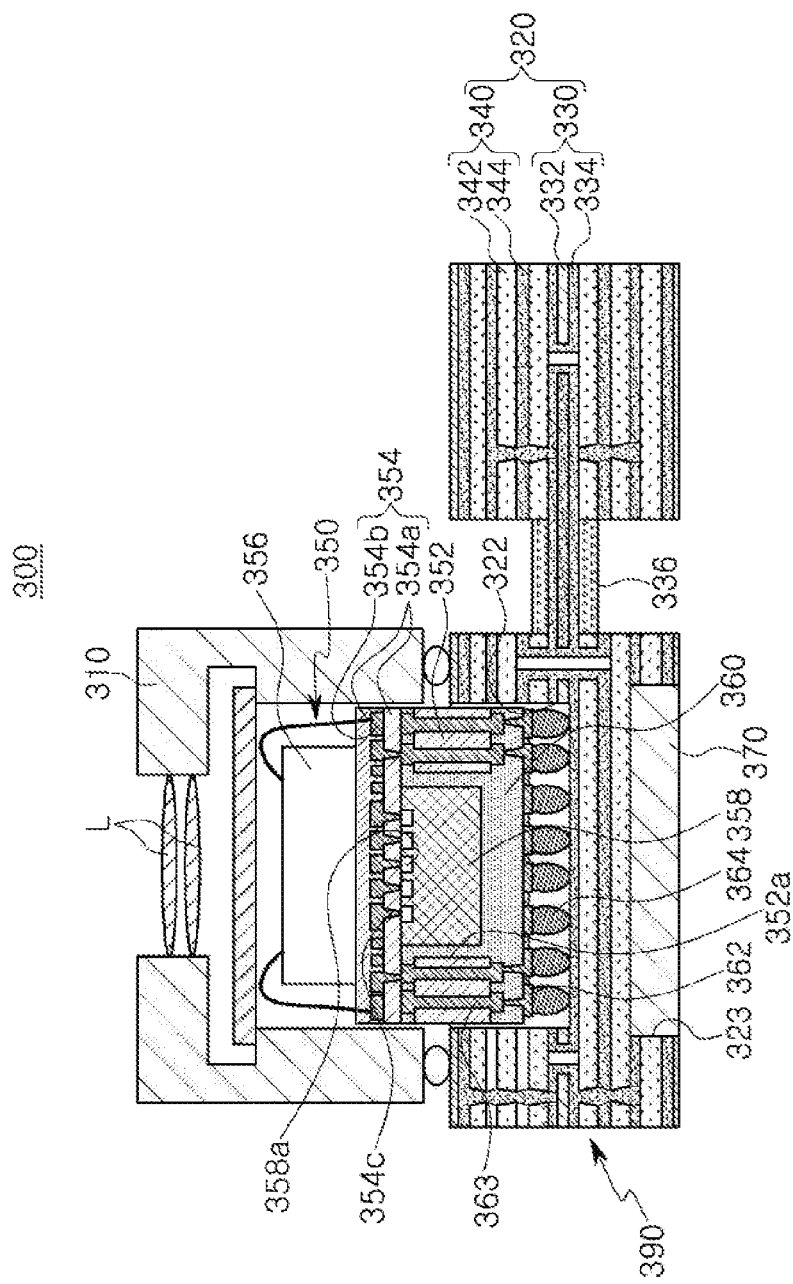
FIG. 3 is a schematic configuration view illustrating a camera module including a substrate for a camera module according to a third exemplary embodiment in the present disclosure.

FIG. 3 is a schematic configuration view illustrating a camera module including a substrate for a camera module according to a third exemplary embodiment in the present disclosure.

Referring to FIG. 3, a camera module 300 according to the third exemplary embodiment may include a lens barrel 310, a first substrate 320, an image sensor package 350, and a reinforcement member 370, for example.

At least one lens L may be installed in the lens barrel 310, and the lens barrel 310 may be installed by bonding it to a top surface of the first substrate 320. As an example, the lens barrel 310 may have a cylindrical hollow shape, and may be formed to have at least one step on an internal surface and/or an external surface.

Although the present exemplary embodiment illustrates a case in which three members are installed in the lens barrel 310, the number of members installed on the lens barrel 210 is not limited thereto.

That is, the number of lenses installed in the lens barrel 310 and a shape of the lens barrel 310 may be variously modified.

The lens barrel 310 may be installed to be fixed to a top surface of the first substrate 320. The first substrate 320 may include a soft substrate portion 330 disposed at a central portion thereof, and hard substrate portions 340 disposed on upper and lower portions of the soft substrate portion 330.

The soft substrate portion 330 may include an insulating film 332 which may be flexibly bent, and a copper foil 334 formed on a top surface and a bottom surface of the insulating film 332. Further, a protection layer 336 may be formed on the soft substrate portion 330 which is exposed to the outside.

In addition, the hard substrate portion 340 may be formed on the upper and lower portions of the soft substrate portion 330. The hard substrate portion 340 may include an insulating layer 342 and a pattern layer 344. In addition, the insulating layer 342 and the pattern layer 344 may be alternately formed.

In addition, a plurality of vias 321 for connecting the copper foil 334 of the soft substrate portion 330 and the pattern layer 344 of the hard substrate portion 340 to each other may be formed in the first substrate 320.

In addition, an installation groove 322 into which the image sensor package 350 is inserted may be formed in the first substrate 320. The installation groove 322 may be formed to be recessed in the top surface of the first substrate 320.

In addition, a reinforcement member mounting groove 323 may be formed to be recessed in a bottom surface of the first substrate 320.

The image sensor package 350 may be installed to be fixed to the first substrate 320. As an example, the image sensor package 350 may be installed on the first substrate 320 so that a lower end portion thereof may be inserted into the installation groove 322 of the first substrate 320.

The image sensor package 350 may include a frame 352, a rewiring part 354, an image sensor 356, a memory chip 358, an encapsulant 360, and an electrode pad 362.

A through-hole 352a, into which the memory chip 358 may be inserted, may be formed in the frame 352. That is, the frame 352 may be disposed to surround the memory chip 358, and may have a plate shape in which the memory chip 358 is disposed in the through-hole 352a, as an example.

The rewiring part 354 may include an insulating layer 354a and a wiring layer 354b. In addition, the image sensor 356 may be installed on a top surface of the rewiring part 354, and the memory chip 358 may be installed on a bottom surface of the rewiring part 354. A via 354c, connected to the memory chip 358, may be formed in the rewiring part 354.

The image sensor 356 may be installed on the top surface of the rewiring part 354, and may be electrically connected to the rewiring part 354 by a wire-bonding. In addition, the image sensor 356 may be disposed below the lens L installed in the lens barrel 310.

The memory chip 358 may be installed on the bottom surface of the rewiring part 354, to be inserted in the through-hole 352a of the frame 352. A connection pad 358a, connected to the via 354c, may be exposed to a top surface of the memory chip 368.

The encapsulant 360 may be filled in a space formed by the memory chip 358 and the through-hole 352a. That is, the encapsulant 360 may serve to fix the memory chip 358 in place, and may additionally perform an electromagnetic interference (EMI) shielding function at the same time.

The electrode pad 362 may be exposed to a bottom surface of the encapsulant 360, and may be connected to the rewiring part 354 through a connection via 363. The connection via 363 may be formed to penetrate through the encapsulant 360 and the frame 352 to thereby be connected to the wiring layer 354b of the rewiring part 354.

A solder ball 364 may be formed on the electrode pad 362 to serve to electrically connect the image sensor package 350 and the first substrate 320 to each other.

The image sensor package 350 may be a fan-out package.

The reinforcement member 370 may be installed, to be inserted into the reinforcement member mounting groove 323, and may be formed of a stainless material, for example. The reinforcement member 370 may serve to prevent the first substrate 320 from being bent when the installation groove 322 is formed. Accordingly, when the image sensor 352 is mounted, flatness may be maintained.

The reinforcement member 370 may have a size corresponding to a size of the installation groove 322, and may be disposed directly below the installation groove 322.

The first substrate 320, the image sensor package 350, and the reinforcement member 370 may configure a substrate 390 for a camera module.

As described above, the image sensor package 350, in which the image sensor 356 is installed on the top surface of the rewiring part 354 and the memory chip 358 is installed on the bottom surface of the rewiring part 354, may be installed in the installation groove 322 of the first substrate 320.

That is, since the memory chip 358 is installed to be adjacent to the image sensor 356, memory capacity required for high speed photography may be provided. Accordingly, the high speed photography may be implemented.

In addition, since the image sensor package 350 may be inserted into the installation groove 322, and the reinforcement member 370 is installed to be inserted into the reinforcement member mounting groove 323, thinness of the camera module may be implemented. That is, an increase in a thickness due to the image sensor package 350 and the reinforcement member 370 may be prevented.

Figure 4:
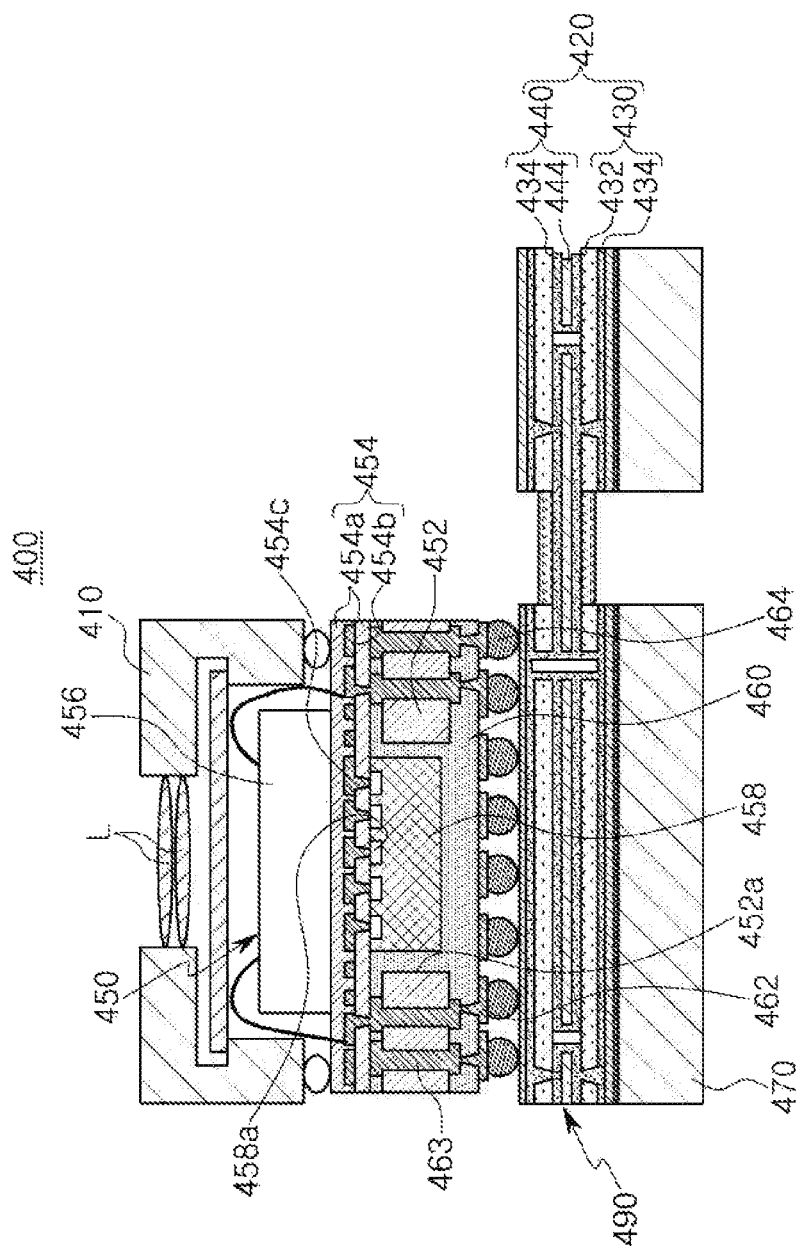
FIG. 4 is a schematic configuration view illustrating a camera module including a substrate for a camera module according to a fourth exemplary embodiment in the present disclosure.

FIG. 4 is a schematic configuration view illustrating a camera module including a substrate for a camera module according to a fourth exemplary embodiment in the present disclosure.

Referring to FIG. 4, a camera module 400 according to the fourth exemplary embodiment may include a lens barrel 410, a first substrate 420, an image sensor package 450, and a reinforcement plate 470, for example.

At least one lens L may be installed in the lens barrel 410, and the lens barrel 410 may be installed by bonding it to a top surface of the first substrate 420. As an example, the lens barrel 410 may have a cylindrical hollow shape, and may be formed to have at least one step on an internal surface and/or an external surface.

Although the present exemplary embodiment illustrates a case in which three members are installed in the lens barrel 410, the number of members installed on the lens barrel 410 is not limited thereto.

That is, the number of lenses installed in the lens barrel 410 and a shape of the lens barrel 410 may be variously modified.

The lens barrel 410 may be installed to be fixed to a top surface of the first substrate 420. The first substrate 420 may include a soft substrate portion 430 disposed at a central portion thereof, and a hard substrate portion 440 disposed on upper and lower portions of the soft substrate portion 430.

The soft substrate portion 430 may include an insulating film 432 which may be flexibly bent and a copper foil 434 formed on a top surface and a bottom surface of the insulating film 432. Further, a protection layer 436 may be formed on the soft substrate portion 430, which is exposed to the outside.

In addition, the hard substrate portion 440 may be formed on the upper and lower portions of the soft substrate portion 430. The hard substrate portion 440 may include an insulating layer 442 and a pattern layer 444 In addition, the insulating layer 442 and the pattern layer 444 may be alternately formed.

In addition, a plurality of vias 421 for connecting the copper foil 434 of the soft substrate portion 430 and the pattern layer 444 of the hard substrate portion 440 to each other may be formed in the first substrate 420.

The image sensor package 450 may be installed to be fixed to the first substrate 420. As an example, the image sensor package 450 may be installed to be seated on a top surface of the first substrate 420.

The image sensor package 450 may include a frame 452, a rewiring part 454, an image sensor 456, a memory chip 458, an encapsulant 460, and an electrode pad 462.

A through-hole 452a in which the memory chip 458 may be disposed to be inserted may be formed in the frame 452. That is, the frame 452 may be disposed to surround the memory chip 458, and may have a plate shape in which the memory chip 458 is disposed in the through-hole 452a, for example.

The rewiring part 454 may include an insulating layer 454a and a wiring layer 454b. In addition, the image sensor 454 may be installed on a top surface of the rewiring part 456, and the memory chip 458 may be installed on a bottom surface of the rewiring part 354. A via 454c connected to the memory chip 458 may be formed in the rewiring part 454.

The image sensor 456 may be installed on the top surface of the rewiring part 454, and may be electrically connected to the rewiring part 454 by a wire-bonding. In addition, the image sensor 456 may be disposed below the lens L installed in the lens barrel 410.

The memory chip 458 may be installed on the bottom surface of the rewiring part 454 so as to be disposed to be inserted in the through-hole 452a of the frame 452. A connection pad 458a connected to the via 454c may be exposed to a top surface of the memory chip 468.

The encapsulant 460 may be filled in a space formed by the memory chip 458 and the through-hole 452a. That is, the encapsulant 460 may serve to fix the memory chip 458, and may additionally perform an electromagnetic interference (EMI) shielding function at the same time.

The electrode pad 462 may be exposed to a bottom surface of the encapsulant 460, and may be connected to the rewiring part 454 through a connection via 463. The connection via 463 may penetrate through the encapsulant 460 and the frame 452 to thereby be connected to the wiring layer 454b of the rewiring part 454.

A solder ball 464 may be formed on the electrode pad 462 to serve to electrically connect the image sensor package 450 and the first substrate 420 to each other.

The image sensor package 450 may be a fan-out package.

The reinforcement plate 470 may be installed on the bottom surface of the first substrate 420, and may be formed of a stainless material, for example. The reinforcement plate 470 may serve to prevent the first substrate 450 from being bent when the image sensor package 450 is installed. Accordingly, when the image sensor 452 is mounted, flatness may be maintained.

The reinforcement plate 470 may have a size corresponding to a size of the first substrate 420.

The first substrate 420, the image sensor package 450, and the reinforcement plate 470 may configure a substrate 490 for a camera module.

As described above, the image sensor package 450, in which the image sensor 456 is installed on the top surface of the rewiring part 454 and the memory chip 458 is installed on the bottom surface of the rewiring part 454, may be installed on the first substrate 420.

That is, since the memory chip 458 is installed to be adjacent to the image sensor 456, memory capacity required for high speed photography may be provided. Accordingly, high speed photography may be implemented.

Figure 5:
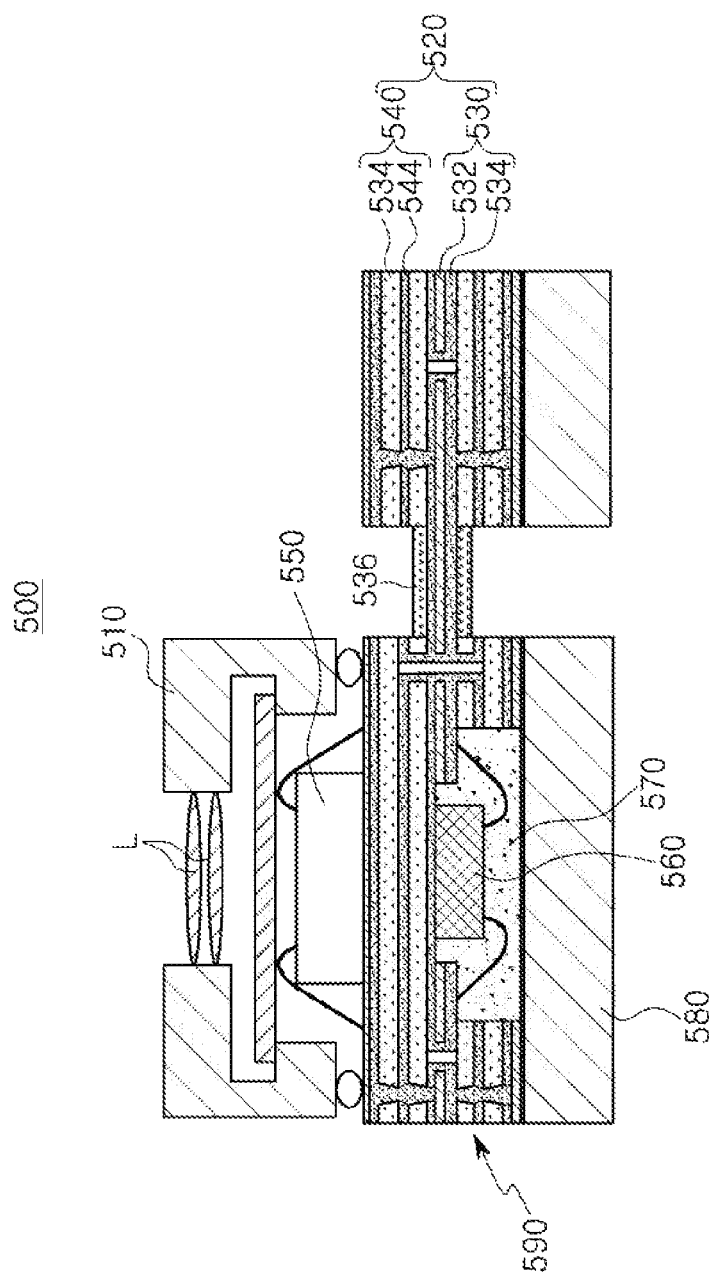
FIG. 5 is a schematic configuration view illustrating a camera module including a substrate for a camera module according to a fifth exemplary embodiment in the present disclosure.

FIG. 5 is a schematic configuration view illustrating a camera module including a substrate for a camera module according to a fifth exemplary embodiment in the present disclosure.

Referring to FIG. 5, a camera module 500, according to the fifth exemplary embodiment, may include a lens barrel 510, a first substrate 520, an image sensor 550, a memory chip 560, a molding layer 570, and a reinforcement plate 580.

At least one lens L may be installed in the lens barrel 510, and the lens barrel 510 may be installed by bonding it to a top surface of the first substrate 520. As an example, the lens barrel 510 may have a cylindrical hollow shape, and may be formed to have at least one step on an internal surface and/or an external surface.

Although the present exemplary embodiment illustrates a case in which three members are installed in the lens barrel 510, the number of members installed on the lens barrel 510 is not limited thereto.

That is, the number of lenses installed in the lens barrel 510 and a shape of the lens barrel 510 may be variously modified.

The lens barrel 510 may be installed on the first substrate 520, and the image sensor 550 may be installed on the first substrate 520 so as to be disposed below the lens L installed in the lens barrel 510.

Meanwhile, the first substrate 520 may include a soft substrate portion 530 disposed at a central portion thereof, and a hard substrate portion 540 disposed on upper and lower portions of the soft substrate portion 530.

The soft substrate portion 530 may include an insulating film 532 which is flexibly bent and a copper foil 534 formed on a top surface and a bottom surface of the insulating film 532. Further, a protection layer 536 may be formed on the soft substrate portion 530, which is exposed to the outside.

The hard substrate portion 540 may be formed on the upper and lower portions of the soft substrate portion 530. The hard substrate portion 540 may include an insulating layer 542 and a pattern layer 544. In addition, the insulating layer 542 and the pattern layer 544 may be alternately formed.

A depressed groove 522, into which the memory chip 560 may be inserted, may be formed in the first substrate 520. The depressed groove 522 may be formed to penetrate through the soft substrate portion 530 from the hard substrate portion 540 disposed on the lower portion of the soft substrate portion 530.

In addition, the depressed groove 522 may be formed to be stepped, and the cooper foil 534 of the soft substrate portion 530 may be formed to be exposed.

Further, a plurality of vias 546, disposed to enable an electrical connection with the copper foil 534 of the soft substrate portion 530, may be formed in the hard substrate portion 540.

The image sensor 550 may be installed on the top surface of the first substrate 520 so as to be disposed below the lens L, and may be electrically connected to the first substrate 520 by a wire-bonding. However, the image sensor 550 is not limited to being connected to the first substrate 520 by the wire-bonding, but may be connected to the first substrate 520 by various methods.

The memory chip 560 may be installed to be embedded in the first substrate 520. As an example, the memory chip 560 may be insertedly disposed in the depressed groove 522 of the first substrate 520. In addition, the memory chip 560 may be electrically connected to the copper foil 534 of the soft substrate portion 530 by the wire-bonding.

As such, since the memory chip 560 is installed in the first substrate 520 to be adjacent to the image sensor 550, memory capacity required for high speed photography may be provided. Accordingly, high speed photography may be implemented.

The molding layer 570 may fill in the recessed groove 522. The molding layer 570 may serve to prevent a cutting of a wire or a short-circuit of the wire-bonding and, at the same time, to protect the memory chip 560.

The reinforcement plate 580 may be installed on the bottom surface of the first substrate 520. As an example, the reinforcement plate 580 may be installed by bonding it to the first substrate 520 through an adhesive.

The reinforcement plate 580 may serve to prevent the first substrate 520 from being bent by the depressed groove 522 when the image sensor 550 is installed. In terms of the composition of the reinforcement plate 580, it may be formed of a stainless material, for example.

However, although the present exemplary embodiment describes a case in which the reinforcement plate 580 is installed by way of example, the reinforcement plate 580 may be omitted.

The first substrate 520, the image sensor 550, the memory chip 560, the molding layer 570, and the reinforcement plate 580 may configure a substrate 590 for a camera module.

As described above, since the memory chip 560 is installed in the first substrate 520 to be adjacent to the image sensor 550, memory capacity required for high speed photography may be provided. Accordingly, high speed photography may be implemented.

That is, since the memory chip 560 is installed in the depressed groove 522 of the first substrate 520, the memory chip 560 may be directly and electrically connected to the image sensor 550 through the first substrate 520. Accordingly, since memory capacity required for high speed photographing may be provided.

As set forth above, according to the exemplary embodiments of the present disclosure, high speed photography may be implemented by providing memory capacity while maintaining a thinness of the camera module.

While exemplary embodiments have been shown and described above, it will be apparent to those skilled in the art that modifications and variations could be made without departing from the scope of the present invention, as defined by the appended claims.

What is claimed is:

1. A substrate for a camera module, the substrate comprising:
   a first substrate;
   an image sensor installed on the first substrate so as to be disposed below a lens; and
   a memory chip embedded in the first substrate,
   wherein the first substrate includes a soft substrate portion disposed at a central portion of the first substrate, and a hard substrate portion formed on upper and lower portions of the soft substrate portion,
   at least a portion of the memory chip is disposed in an installation hole formed in the soft substrate portion,
   the hard substrate portion disposed on the upper portion of the soft substrate portion includes a via for a connection with the memory chip, and
   the memory chip includes a connection pad exposed to a top surface of the memory chip to be connected to the via.

2. The substrate for a camera module of claim 1, wherein a mounting groove connecting the hard substrate portion disposed on the lower portion of the soft substrate portion to the hard substrate portion disposed on the upper portion of the soft substrate portion, through the soft substrate portion, is formed in the first substrate.

3. The substrate for a camera module of claim 2, wherein a resin layer is formed in a space formed by the installation hole and the memory chip.

4. The substrate for a camera module of claim 1, wherein a reinforcement plate is installed on a bottom surface of the first substrate.

5. A camera module comprising:
a lens barrel in which at least one lens is installed; and
the substrate for a camera module of claim 1 on which the lens barrel is installed and in which an image sensor is disposed below the lens.

* * * * *